(12) United States Patent
Peterson

(10) Patent No.: US 7,034,542 B2
(45) Date of Patent: Apr. 25, 2006

(54) CURRENT SENSING CIRCUIT AND METHOD

(75) Inventor: Kirk David Peterson, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/785,688

(22) Filed: Feb. 24, 2004

(65) Prior Publication Data

US 2005/0184721 A1   Aug. 25, 2005

(51) Int. Cl.
*G01R 15/12* (2006.01)

(52) U.S. Cl. .................. 324/522; 324/769; 318/434

(58) Field of Classification Search ............ 324/117 R, 324/769, 772, 522; 388/821–823; 318/432–433
See application file for complete search history.

(56) References Cited

U.S. PATENT DOCUMENTS

| | | | | |
|---|---|---|---|---|
| 3,855,511 A | * | 12/1974 | Smith | .................. 388/823 |
| 4,048,575 A | * | 9/1977 | Musa | .................. 330/253 |
| 4,931,725 A | * | 6/1990 | Hutt et al. | .................. 324/142 |
| 5,646,520 A | * | 7/1997 | Frank et al. | ............. 324/158.1 |
| 5,959,417 A | * | 9/1999 | Maggio et al. | ............. 318/254 |
| 5,977,751 A | * | 11/1999 | Blessing et al. | ............ 320/134 |
| 6,624,671 B1 | * | 9/2003 | Fotouhi | ...................... 327/112 |
| 2003/0067317 A1 | * | 4/2003 | Dubhashi | .................... 324/763 |
| 2003/0218455 A1 | * | 11/2003 | Tai et al. | ..................... 323/316 |
| 2004/0135583 A1 | * | 7/2004 | Gunton | ....................... 324/537 |
| 2004/0227539 A1 | * | 11/2004 | Thiery | ....................... 324/769 |

* cited by examiner

*Primary Examiner*—Anjan Deb
(74) *Attorney, Agent, or Firm*—W. Daniel Swayze, Jr.; W. James Brady; Frederick J. Telecky, Jr.

(57) ABSTRACT

The present invention includes a plurality of FETs (211, 212, 213, 214, 215, 216, 217) including an operational amplifier with additional FETs (218, 219, 220, 221) arranged as current mirrors, and a sense FET (101), and a current sensed at FET (101) is amplified, compared to a reference signal, the difference current derived from the amplified sense current and reference signal being amplified and provided at an output for use in control applications.

20 Claims, 1 Drawing Sheet

CURRENT SENSING CIRCUIT AND METHOD

FIELD OF THE INVENTION

The present invention generally relates to circuits and methods for current sensing, for use in a variety of applications including motor driver control circuits and servo circuits.

BACKGROUND OF THE INVENTION

Motor driver circuits are essentially small current amplifiers or transconductance amplifiers. In a small current amplifier, the input is a control current and the output is a current that can be used to drive a motor. In a transconductance amplifier, the input is a control voltage and the output is a current that can be used to drive a motor. As can be seen, the function of these circuits is to take a low-current or voltage control signal, and turn it into a proportionally higher-current signal. For example, in a motor driver circuit, the control signal may be on the order of microamps or milliamps, and the motor may require amps for operation.

Typical in such motor driver circuits is an ancillary current sensing circuit. Current sensing is required for accurate control of the device under control. Current limiting in these circuits is essential. For example, if a motor is stalled, it might accept large currents that can destroy the FETs in the motor driver circuit, such as an H-bridge. One method of sensing current that is suitable for current control or limiting is to measure the current that is flowing through the motor. If the current is above a certain threshold, then the motor driver control circuit operates to turn the FETs in the H-bridge off.

Some motor driver circuits utilize pulse width modulation ("PWM") techniques to more energy efficiently control the controlled device. However, these circuits that have an on-board micro-controller generating a PWM signal to drive a motor have certain drawbacks. For example, the micro-controller can be configured send a signal to reduce the PWM ratio if an over-current status is detected. However, there is a latency between detection of the over-current condition and the response. Disadvantageously, this delay can result in an over-current condition before the PWM ratio is reduced, thus damaging sensitive devices.

Conventional current sensing arrangements often use a sense resistor, across which the voltage is amplified in a first amplifier and then sent to a second amplifier circuit. The output of the first amplifier can be low pass filtered to filter out motor noise. The second amplifier compares the amplified sense resistor voltage to a reference signal and if the amplified sense resistor voltage is higher than the reference signal, then the PWM signals driving the H-bridge FET drivers can be diverted to ground or otherwise modulated to reduce current to the motor. These arrangements consume power and require a large area to implement the design.

Some circuits sample the current through a main power FET using a much narrower FET placed in parallel with the main power FET. In such case, the measured, or sensed, current depends on the ratio of the widths of the two FETs, assuming they have the same terminal voltages. In these arrangements, the measured current is dependent on the current flowing through the narrower FET as well as the temperature, and thus accurate control is difficult to achieve.

What is desired is an improved current sensing circuit and method having improved accuracy of current sensing with at least one sense FET, that is adapted to provide programmability, filtering, noise reduction, and improved precision in an area efficient scheme.

SUMMARY OF THE INVENTION

The present invention achieves technical advantages as a circuit and method designed to sense current in a circuit, such as a motor driver control circuit. The present invention achieves certain advantages by integrating the sense FET and current mirrors into a voltage following operational amplifier circuit and mirroring the sensed current off the internal current mirrors.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

The numerous innovative teachings of the present invention will be described with particular reference to a motor driver control application. However, it should be understood that the motor driver control circuit is only one example of the many advantageous applications and innovative teachings herein. In general, statements made in the specification of the present motor driver control circuit application do not necessarily delimit any of the various claimed inventions. Moreover, some statements may apply to some inventive features, but not to others. Detailed descriptions of known functions and constructions unnecessarily obscuring the subject matter of the present invention have been omitted for clarity.

The present invention achieves technical advantages as a current sensing circuit and method due to its improved accuracy of current sensing with at least one sense FET. A plurality of sense FETs may be connected in parallel and/or separated by switches for variable control current definitions. The present invention is particularly adapted to provide programmability, filtering, noise reduction, and improved precision in an area efficient scheme. The present invention achieves these advantages by integrating a sense FET with a voltage following operational amplifier circuit, and then mirroring the sensed current off the internal current mirror(s).

Figure 1:
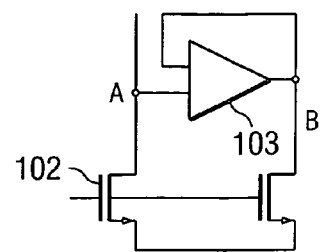
FIG. 1 is a schematic diagram of a conventional current sensing circuit using an operational amplifier and sense FET.
Figure 2:
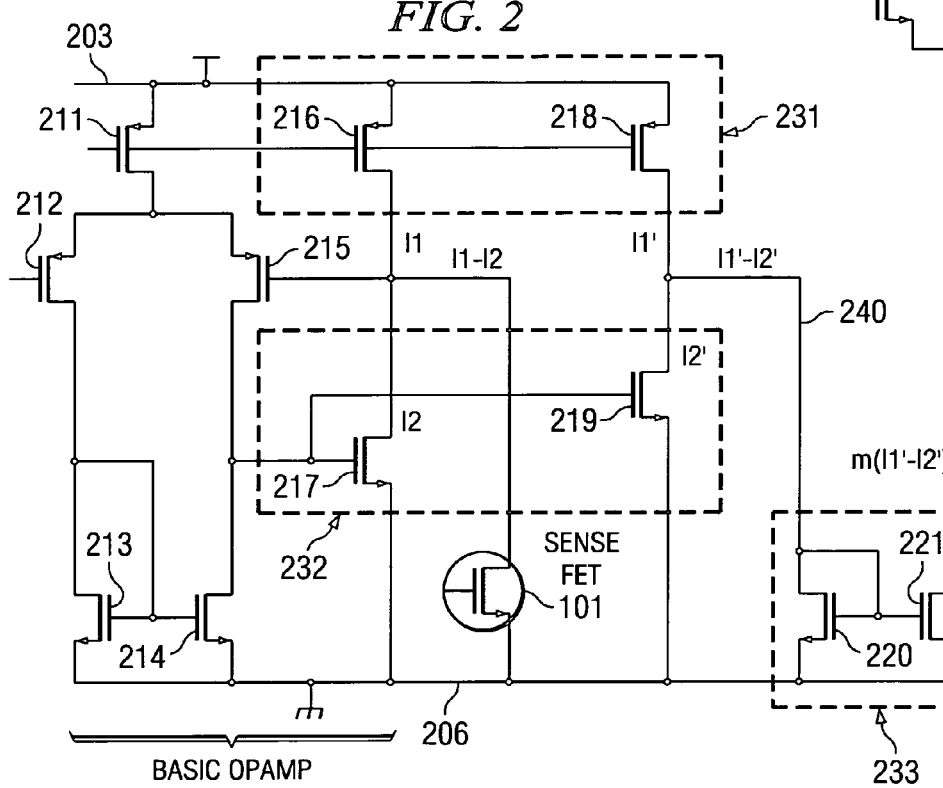
FIG. 2 is a schematic diagram of the current sensing circuit of the present invention.

FIG. 1 is a circuit diagram of a conventional current sensing configuration. As seen in FIG. 1, the sense FET based current sensing configuration utilizes a circuit to match the nodal voltages on sense FET 101 and the power FET 102. One such configuration uses a "diode-up/diode-down" topology to drive the appropriate current and match voltages. Another configuration is a standalone operational amplifier type as seen in FIG. 1. Specifically, power FET 102 is placed in parallel with a smaller sense FET 101, and a circuit, seen as operational amplifier 103, operable to match the drain voltage. The present invention also utilizes a sense FET and operational amplifier, although with additional components arranged in a novel manner. As seen in FIG. 2, the operational amplifier comprises seven transistors 211, 212, 213, 214, 215, 216 and 217. Sense FET 101 is also seen in FIG. 2. The present invention comprises a modification to the standalone operational amplifier circuit to provide a replica of the sense FET current, which can be readily amplified, attenuated, filtered, or otherwise modified. The replica current is not dependent on the voltages of the driver circuit, and can be combined with other current signals for further control. It is also possible to integrate the sense FET directly into the circuit design of the operational amplifier in order to save area on an integrated circuit chip.

Referring to FIG. 2, the operational amplifier of the present invention comprises seven transistors 211, 212, 213, 214, 215, 216 and 217. For purposes of clarity, operational amplifier compensation elements are not shown. The disclosed embodiment of the present invention further comprises three current mirrors 231, 232, and 233. As seen therein, drain currents from FETs 216 and 217 are labeled I1 and I2. The two p-channel FETs 216 and 218 comprise current mirror 231 whereby current I1' is mirrored by current I1, assuming the two FETs 216 and 218 are the same size, or K*I1 if FETs 216 and 218 are different sizes. Similarly, the two n-channel FETs 217 and 219 form current mirror 232 wherein current I2'=K2*I2, where K2 may be =1 if the FETs are the same size. The two FETs 220 and 221 form current mirror 233 and provide the output current M*(I2'−I1')=M*(K2*I2−K*I1). This current is a multiple of the sense FET 101 current and is typically used for the control applications.

In operation, the sense FET 101 current is the difference between the current in p-channel FET 216, with drain current I1, and the current in the n-channel FET 217 with drain current I2. In this configuration, current through sense FET 101=I1−I2. By using an operational amplifier to force the same drain voltage across sense FET 101 as the main power FET, it is straightforward to extract replica copies of I1 and I2 using current mirrors 231 and 232. By connecting the output of current mirrors 231 and 232, the difference in the mirror currents is identical, except for a scale factor if desired, to the sense FET 101 current. This current can then be used for control applications.

The means of coupling current mirrors 231 and 232 also allow direct low pass filtering for, among other things, noise rejection and glitch filtering by adding some capacitance to the node 240, labeled I1'−I2'. In a conventional current sensing arrangement, trimming of sense FETs is difficult. With the present invention, it is straightforward to trim the current mirrors 231 and 232 for the same effect.

Figure 3:
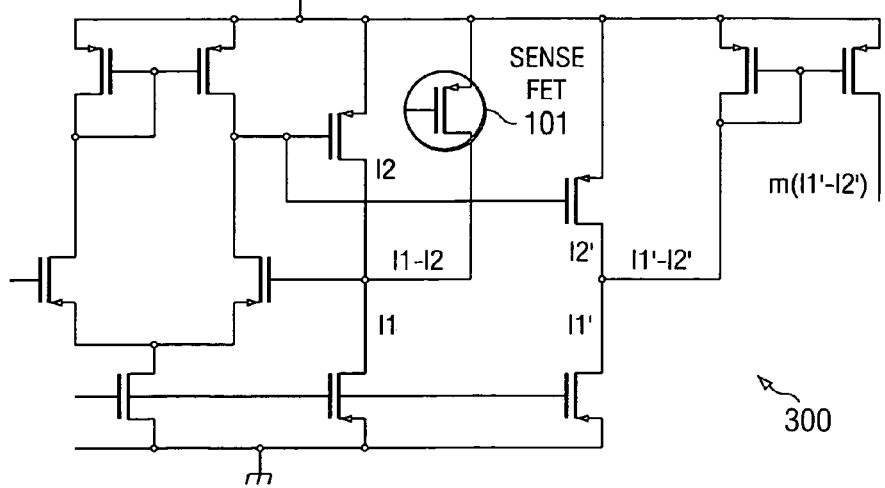
FIG. 3 is a schematic diagram of an inverted circuit of the present invention.

Another application of the present invention is the determination of total device supply current through an isolation MOSFET, such as servo devices. In order to implement the foregoing application, the circuit of FIG. 2 would be inverted as seen in FIG. 3. As seen in FIG. 3, circuit 300 is referenced to the positive supply rail instead of to ground. The simple trimming scheme of the present invention allows a much tighter current limit specification without other performance penalties or challenges such as setting comparator thresholds to small limits on very noisy signals. The output of the present invention is a high impedance signal. As such, summing of signals or other signal handling operations can be facilitated.

The present invention achieves significant improvements in die area utilization over conventional operational amplifier/sense FET combinations. This is because the additions to the operational amplifier to include the current mirrors are typically small, relative to the size of the operational amplifier, and to other circuits used to control sense FET currents. Further, conventional current sense schemes that use an external resistor to sense the current require the use of large power FETs. Conventionally, the addition of a sense resistor for sensing and control causes the power FETs to be large, in order to maintain total on-resistance. Thus, the use of the present invention can result in substantial space savings on the die.

Another advantage of the present invention over conventional current sensing arrangements is the availability of an output signal with a current proportional to the sensed current that can be easily gained up from the sensed current by current mirror sizing.

A further advantage of the present invention is the ability to trim the output signal easily by adjusting the FET dimensions. The current gain of the current mirror is simply the ratio of the widths of the FETs assuming they have the same length, as is conventional in the industry. Therefore, adding switches to connect a variable effective total width can be used to adjust the current gain, or total effective sensed current.

A disadvantage of conventional techniques is that the sense current is normally very noisy due to commutation and switching noise found in motor drive applications. Typical low side power MOSFETs have significant noise coupled onto the sense node through the circuit used to maintain the same drain voltage across the power FET and the sense FET. A common example of this is the double diode scheme which connects the two MOSFETs with a pair of diodes, creating a low impedance noise-coupling path to the sense FET. Advantageously, in the present invention, the drain of the sense FET is isolated from the noisy main power FET drain by the operational amplifier. Consequently, the sense FET has less noise contaminating the sensed current.

The present invention can be further adapted to filter or blank the noise from inductive switching in the replicated signal. One method to achieve this objective is to limit the operational amplifier bandwidth to attenuate high frequency glitches using ordinary bandwidth limiting techniques for operational amplifier design. Other more complex methods of filter or blanking noise are facilitated by the generation of a high impedance, possibly scaled, and/or sampled replicated current.

The exemplary embodiment of the present invention is described with reference to a motor driver control circuit. The exemplary embodiment of the present invention addresses many of the shortcomings of the prior art. The present invention may be described herein in terms of various functional components. It should be appreciated that such functional components may be realized by any number of hardware or structural components configured to perform the specified functions. For example, the present invention may employ various integrated components which are comprised of various electrical devices, such as resistors, transistors, capacitors, diodes and the like whose values may be suitably configured for various intended purposes. The present invention is not limited to being implemented with p-channel, n-channel or double-diffused MOS ("DMOS"), MOSFETs or power MOSFETs. The present invention can be implemented with other types of transistors, or resistors, as long as the current ratio determination depends on matching two (2) terminal voltages. Additionally, the various components may be implemented in alternate ways, such as, for example, the changing of polarity types of transistor devices and the changing of the polarity of the circuits.

These alternatives can be suitably selected depending upon the particular application or in consideration of any number of factors associated with the operation of the systems. Such general applications that may be appreciated by those skilled in the art in light of the present disclosure are not described in detail herein. Further, it should be noted that while various components may be suitably coupled or connected to other components within the exemplary circuit, such connections and couplings can be realized either by direct connection between components, or by connection through other components and devices located there between. These and other changes or modifications are intended to be included within the scope of the present invention, as expressed in the following claims.

What is claimed is:

1. A current sensing circuit, comprising:
    a sense FET with an input at its gate;
    an operational amplifier circuit with an input responsively coupled to the sense FET;
    the operational amplifier operable to force the same drain voltage across the sense FET as across a main power FET
    a first FET with a first polarity within the operational amplifier;
    a second FET with an opposite polarity of the first FET, the second FET within the operational amplifier and being responsively coupled in series with the first FET;
    the sense FET operable to provide a current to the operational amplifier that is the difference between the drain current I1 of first FET and the drain current I2 of the second FET;
    at least three current mirrors;
    a first current mirror and a second current mirror operable to extract replica copies of the drain current I1 from the first FET and the drain current I2 of the second FET, respectively; and
    a third current mirror responsively coupled to the first current mirror and the second current mirror and operable to output a current that is a multiple of the sense FET current.

2. The current sensing circuit of claim 1, further comprising:
    the first FET comprising one side of the first current mirror;
    the second FET comprising one side of the second current mirror;
    the first current mirror being operable to mirror I1 with I1' from a third FET, when the first FET and the third FET are substantially the same size;
    the first current mirror being operable to scale I1 with I1', on the basis of K*I1, when the first FET and the third FET are different sizes;
    the second current mirror being operable to mirror I2 with I2' from a fourth FET when the second FET and fourth FET are the same size;
    the second current mirror being operable to scale I2 with I2', on the basis of K*I2, when the second FET and the fourth FET are different sizes;
    a fifth FET and a sixth FET comprising the third current mirror; and
    the third current mirror responsively coupled to the second FET and fourth FET and operable to output a current that is a multiple of the sense FET current.

3. The current sensing circuit of claim 2, further comprising the first current mirror being comprised of MOSFETs having a first polarity and the second and third current mirrors being comprised of MOSFETs having a second polarity opposite that of the first current mirror MOSFETs.

4. The current sensing circuit of claim 3, wherein the MOSFETs of the first current mirror are n-channel MOSFETs.

5. The current sensing circuit of claim 3, wherein the MOSFETs of the first current mirror are p-channel MOSFETs.

6. The current sensing circuit of claim 2, wherein the output of the third current mirror has the form $M*(I2'-I1')=M*(K2*I2 - K*I1)$.

7. The current sensing circuit of claim 1, wherein the difference in the mirror currents is identical.

8. The current sensing circuit of claim 1, wherein the difference in the mirror currents is different based on a scale factor to the sense FET current.

9. The current sensing circuit of claim 8, wherein the scale factor is set by adjusting the FET dimensions of the current mirror FETs.

10. The current sensing circuit of claim 1 wherein the operational amplifier is configured as a voltage following operational amplifier.

11. The current sensing circuit of claim 1 wherein the current mirror circuits are integrated into the operational amplifier circuit.

12. The current sensing circuit of claim 1, wherein the current mirrors within the voltage following operational amplifier circuit are adapted to output mirrored sensed current for motor control.

13. The current sensing circuit of claim 1, wherein the FETs further comprise MOSFETs.

14. The current sensing circuit of claim 13, wherein the MOSFETs further comprise DMOS transistors.

15. The current sensing circuit of claim 1, being configured using capacitive coupling to filter or blank the noise from inductive switching in the replicated current signals.

16. The current sensing circuit of claim 1 wherein the operational amplifier bandwidth is adjustable to attenuate high frequency glitches.

17. The current sensing circuit of claim 16 wherein the operational amplifier bandwidth is adjusted by the generation of a high impedance replicated current.

18. The current sensing circuit of claim 1, wherein such circuit is implemented in an integrated circuit.

19. The current sensing circuit of claim 1 for use in a motor driver control circuit.

20. The current sensing circuit of claim 1 for use in a light dimmer control circuit.

* * * * *